(12) United States Patent
Nakakubo

(10) Patent No.: US 8,345,503 B2
(45) Date of Patent: Jan. 1, 2013

(54) BOOSTER CIRCUIT AND SEMICONDUCTOR MEMORY

(75) Inventor: Atsushi Nakakubo, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 310 days.

(21) Appl. No.: 12/892,251

(22) Filed: Sep. 28, 2010

(65) Prior Publication Data
US 2011/0075487 A1  Mar. 31, 2011

(30) Foreign Application Priority Data

Sep. 29, 2009  (JP) ................................. 2009-224808

(51) Int. Cl.
*G11C 5/14* (2006.01)
(52) U.S. Cl. .................. 365/226; 365/189.09; 365/227; 327/536
(58) Field of Classification Search .................. 365/226, 365/189.09, 227; 327/536
See application file for complete search history.

(56) References Cited

U.S. PATENT DOCUMENTS

2009/0174466 A1\* 7/2009 Hsieh et al. ................... 327/536
2011/0012671 A1\* 1/2011 Chuang et al. ................ 327/536

FOREIGN PATENT DOCUMENTS

JP  6-283667 A  10/1994

\* cited by examiner

*Primary Examiner* — Vu Le
*Assistant Examiner* — Han Yang
(74) *Attorney, Agent, or Firm* — Fujitsu Patent Center

(57) ABSTRACT

A booster circuit includes a first capacitor and a second capacitor serially coupled between a first node and a second node through a third node; a third capacitor and a fourth capacitor serially coupled between a fourth node and a fifth node through a sixth node; a first switch coupling the third node with a power supply line when the fourth node is set to a first level; a second switch coupling the sixth node with the power supply line when the first node is set to the first level; a third switch transferring a plurality of electric charges of the sixth node to the second node; a fourth switch transferring a plurality of electric charges of the third node to the fifth node; a fifth switch coupling the second node with a voltage line; and a sixth switch coupling the fifth node with the voltage line.

11 Claims, 8 Drawing Sheets

BOOSTER CIRCUIT AND SEMICONDUCTOR MEMORY

CROSS-REFERENCE TO RELATED APPLICATIONS

This application is based upon and claims the benefit of priority of the prior Japanese Patent Application No. 2009-224808, filed on Sep. 29, 2009, the entire contents of which are incorporated herein by reference.

FIELD

The disclosure generally relates to a booster circuit and a semiconductor memory that includes the booster circuit.

BACKGROUND

A booster circuit is known that generates a high voltage by utilizing charging/discharging a capacitor and the coupling effect. In order to reduce an area of the circuit, for example, a capacitor of a booster circuit is formed by using an insulating film between a floating gate of a nonvolatile memory cell and a diffusion layer of a nonvolatile memory cell, and an insulating film between a control gate of a nonvolatile memory cell and a floating gate of a nonvolatile memory cell (for example, Japanese Laid-open Patent Publication No. H6-283667).

In a booster circuit, when electric charges accumulated in a capacitor are discharged to a grounding wire etc., some of the electric charges do not contribute to generate a high voltage. Hence, an efficiency to generate a high voltage by the booster circuit decreases and thereby power consumption increases.

SUMMARY

According to an aspect of the invention, a booster circuit includes a first capacitor and a second capacitor serially coupled between a first node and a second node through a third node; a third capacitor and a fourth capacitor serially coupled between a fourth node and a fifth node through a sixth node; a first switch that couples the third node with a power supply line when the fourth node is set to a first level; a second switch that couples the sixth node with the power supply line when the first node is set to the first level; a third switch that transfers a plurality of electric charges of the sixth node to the second node; a fourth switch that transfers a plurality of electric charges of the third node to the fifth node; a fifth switch that couples the second node with a voltage line; and a sixth switch that couples the fifth node with the voltage line.

According to another aspect of the invention, a semiconductor memory includes a booster circuit that includes: a first capacitor and a second capacitor serially coupled between a first node and a second node through a third node; a third capacitor and a fourth capacitor serially coupled between a fourth node and a fifth node through a sixth node; a first switch that couples the third node with a power supply line when the fourth node is set to a first level; a second switch that couples the sixth node with the power supply line when the first node is set to a first level; a third switch that transfers a plurality of electric charges of the sixth node to the second node; a fourth switch that transfers a plurality of electric charges of the third node to the fifth node; a fifth switch that couples the second node with a voltage line; and a sixth switch that couples the fifth node to the voltage line; a booster control circuit configured to alternately set the first node and the fourth node to the first level and turns on the fourth switch and the fifth switch while the first node is set to the first level and turns on the third switch and the sixth switch while the fourth node is set to the first level; and a memory cell that includes a control gate, wherein a voltage supplied to the control gate is generated by using a voltage that is generated by the booster circuit to the voltage line.

The object and advantages of the invention will be realized and attained by the elements, features, and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 3:
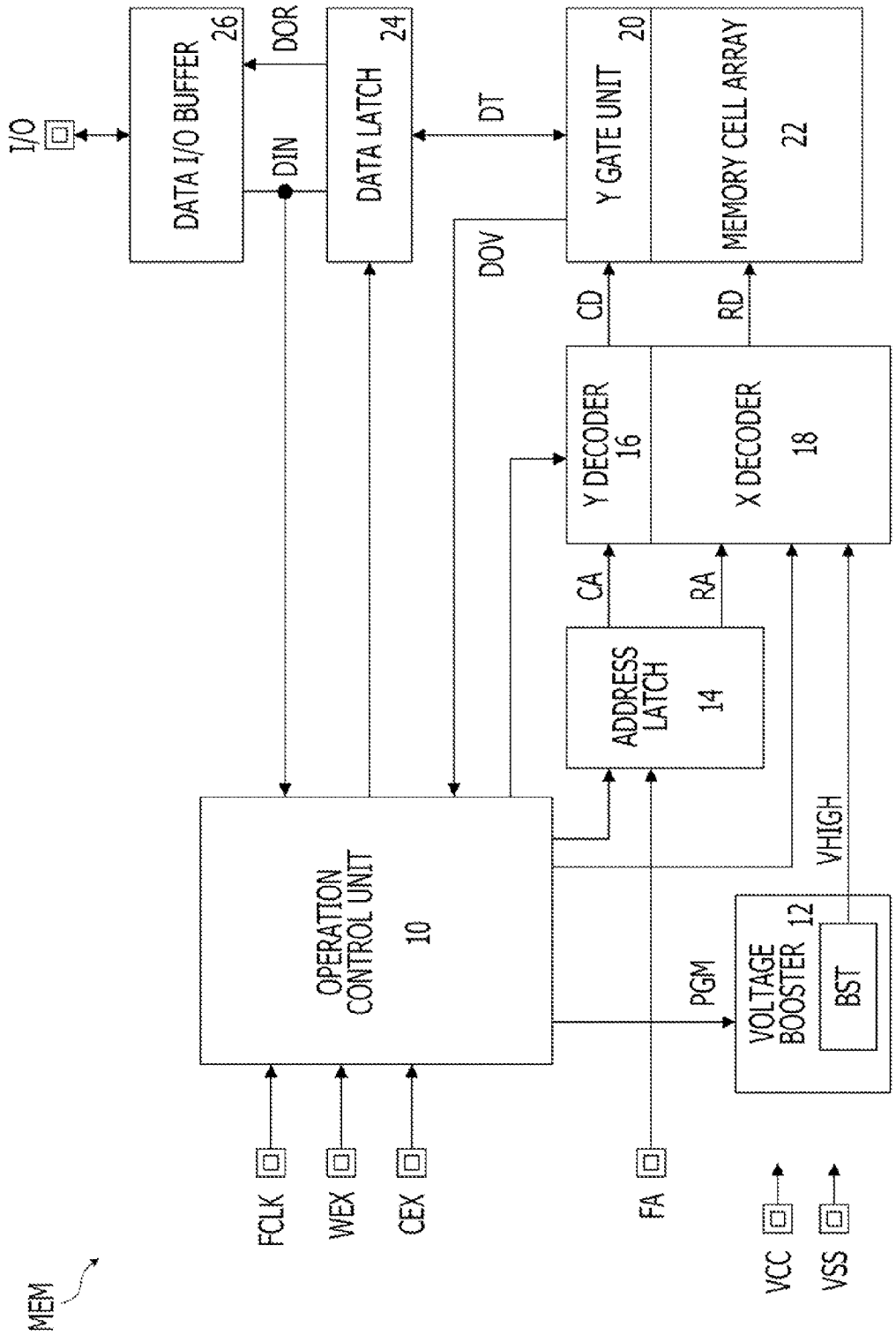
FIG. 3 illustrates an example of a semiconductor memory cell that includes the booster circuit illustrated in FIG. 1.

Hereinafter, an embodiment will be described by referring to accompanying drawings. In FIG. 3, a signal with "X" at the end indicates a negative logic. The double square in FIG. 3 indicates an external terminal. The external terminal is, for example, a pad over a semiconductor chip, or a lead of a package in which a semiconductor chip is accommodated. The same reference numeral as the name of the terminal is applied to a signal supplied from the external terminal.

Figure 1:
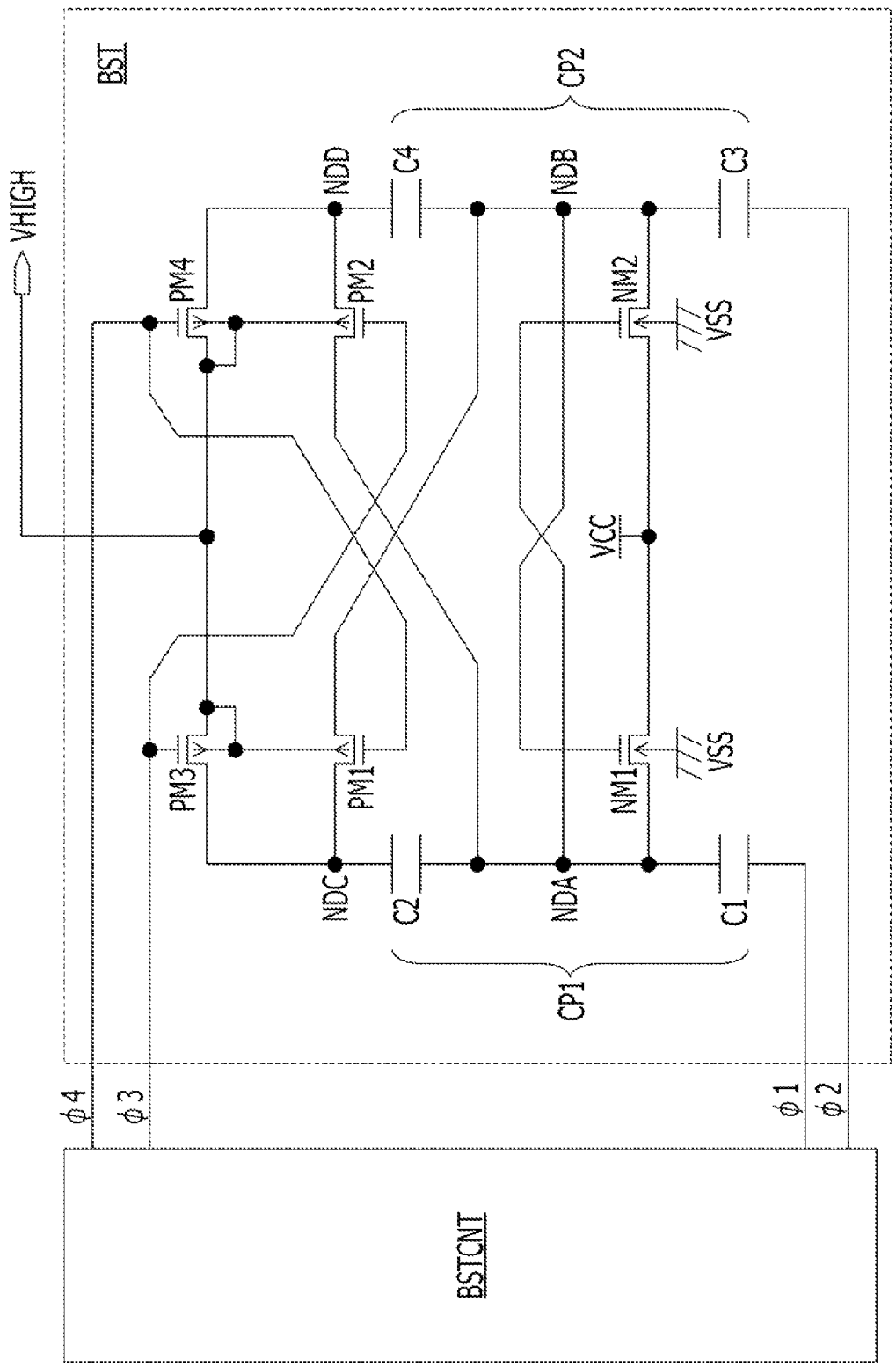
FIG. 1 illustrates an example of a booster circuit according to an embodiment.

FIG. 1 illustrates an example of a booster circuit BST according to an embodiment. The booster circuit BST includes capacitors C1 and C2 (a pair of capacitors CP1) that are serially coupled between a node φ1 and a node NDC through a node NDA, and capacitors C3 and C4 (a pair of capacitors CP2) that are serially coupled between a node φ2 and a node NDD through a node NDB. Moreover, the booster circuit BST includes switches NM1, NM2, and PM1 to PM4. The switches NM1 and NM2 may be, but are not limited to, for example, n-type Metal Oxide Semiconductor (nMOS) transistors and the switches PM1 to PM4 may be, but are not limited to, for example, p-type Metal Oxide Semiconductor (pMOS) transistors.

In a transistor NM1, a gate is coupled to the node NDB, a source is coupled to the node NDA, a drain is coupled to a voltage line VCC, and a substrate (not shown in FIG. 1) is coupled to a voltage line VSS. For example, the voltage line VCC is a power supply line, and the voltage line VSS is a grounding wire. The power supply voltage VCC may be, but is not limited to, about 5V. In the transistor NM2, a gate is coupled to the node NDA, a source is coupled to the node NDB, and a drain is coupled to the voltage line VCC, and a substrate is coupled to the voltage line VSS.

In the transistor PM1, a gate is coupled to a node φ4, a source is coupled to the node NDC, a drain is coupled to the node NDB, and a substrate is coupled to a high voltage line VHIGH. In the transistor PM2, a gate is coupled to a node φ3, a source is coupled to the node NDD, a drain is coupled to the node NDA, and a substrate is coupled to the high voltage line VHIGH. In the transistor PM3, a gate is coupled to the node φ3, a source is coupled to the NDD, the source and a substrate are coupled to the high voltage line VHIGH, and a drain is coupled to the node NDC. In the transistor PM4, a gate is coupled to the node φ4, and a source and a substrate are coupled to the high voltage line VHIGH, and a drain is coupled to the node NDD. For example, the booster circuit BST generates about 9.5 V of a high voltage VHIGH from about 5V of a power supply voltage VCC.

The nodes φ1 to φ4 receive clocks for generating a high voltage at the node VHIGH. For example, clocks supplied to the nodes φ1 to φ4 are generated by a booster control circuit BSTCNT. The booster control circuit BSTCNT may be formed in the booster circuit BST.

The nodes φ1 and φ2 are alternately set to a high level. A voltage of the node NDA increases in response to a high level of the node φ1, thereby turning on the switch NM2. A voltage of the node NDB increases in response to a high level of the node φ2, thereby turning on the switch NM1. The node φ3 is set to a low level in order to turn on the switches PM3 and PM2 while the node φ1 is set to a high level. The node φ4 is set to a low level in order to turn on the switches PM4 and PM1 while the node φ2 is set to a high level. The details of operations of the booster circuit BST are illustrated in FIG. 2.

Figure 2:
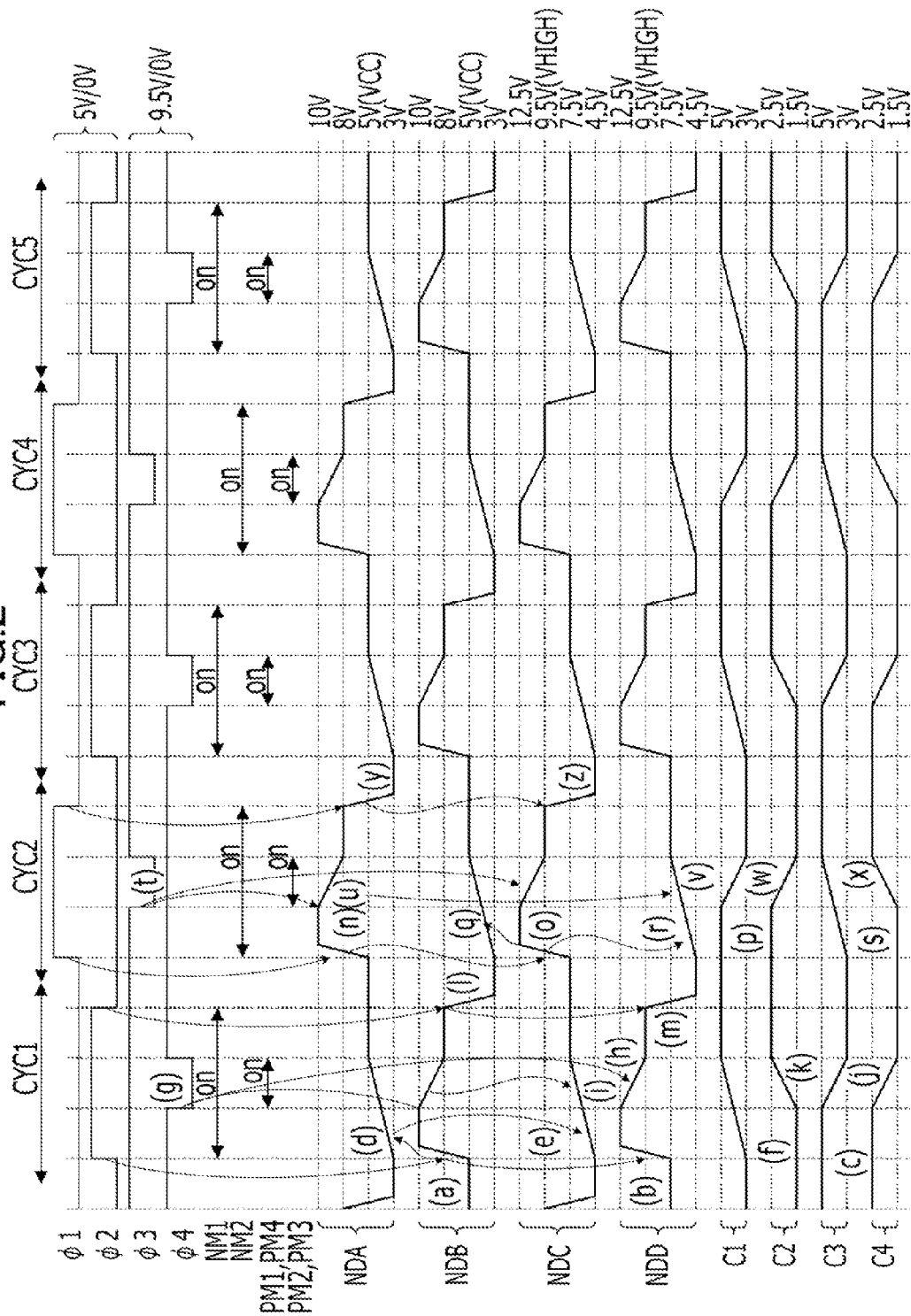
FIG. 2 illustrates an operation example of the booster circuit illustrated in FIG. 1.

FIG. 2 illustrates an operation example of the booster circuit illustrated in FIG. 1. For example, the clocks φ1 to φ4 are generated by the booster control circuit BSTCNT illustrated in FIG. 1. The clocks φ1 and φ2 may be alternately set to a high level and each of the high level periods of the clocks φ1 and φ2 may not be overlapped. The clock φ3 is set to a low level for a certain period while the clock φ1 is in a high level period. The clock φ4 is set to a low level for a certain period while the clock φ2 is in a high level period. Although not limited to such a configuration, amplitudes of the clock φ1 and the clock φ2 may be about 5 V and about 0 V respectively, and amplitudes of the clock φ3 and the clock φ4 may be about 9.5 V and about 0 V respectively.

In a cycle CYC1, when the clock φ2 changes to a high-level, a voltage of the node NDB increases by a coupling effect of the capacitor C3 ((a) in FIG. 2). According to an aspect, the voltage of the node NDB is set to about 5V (VCC) through the switch NM2 before the clock φ2 changes to a high level. Thus, the voltage of the node NDB generally increases about 5V, that is substantially the same as the amplitude of the clock φ2, and becomes about 10 V. By following-up the voltage change of the node NDB, the voltage of the node NDD increases by a coupling effect of the capacitor C4 ((b) in FIG. 2). The voltage of the node NDD is set to about 7.5 V through the switch PM2 before the clock φ2 changes to a high level. The voltage of the node NDD increases about 5 V that is substantially the same as the amplitude of the clock φ2 and becomes about 12.5 V.

The voltage of the node NDB changes by following-up a voltage of the clock φ2. Thus, a voltage applied to the capacitor C3 is maintained to about 5 V before and after the voltage change of the clock φ2. Similarly, the voltage of the node NDD changes by following-up the voltage of the node NDB. Thus, a voltage applied to the capacitor C4 is maintained to about 2.5 V before and after the voltage change of the clock φ2 ((c) in FIG. 2).

An increase in the voltage of the node NDB turns on the switch NM1, thereby the node NDA is coupled to the power supply line VCC. Accordingly, the node NDA is pre-charged up to the power supply voltage VCC (about 5 V) ((d) in FIG. 2). By following-up the voltage change of the node NDA, the voltage of the node NDC increases by a coupling effect of the capacitor C1 ((e) in FIG. 2). The voltage applied to the capacitor C1 gradually increases as the voltage of the node NDA increases. The increase in voltages of the nodes NDA and NDC are due to coupling effects, therefore, the voltage applied to the capacitor C2 is not substantially changed ((f) in FIG. 2).

The clock φ4 changes from a high level to a low level for a certain period while the clock φ2 is in a high level period ((g) in FIG. 2). The low level of the clock φ4 turns on the switches PM4 and PM1. The electric charges charged to the node NDD are transferred to the node VHIGH through the switch PM4. As a result, the voltage of the node VHIGH increases to about 9.5 V and the voltage of the node NDD decreases to about 9.5 V. Turning on the switch PM1 causes charge sharing between the nodes NDB and NDC, and electric charges accumulated in the node NDB are transferred to the node NDC. In other words, electric charges accumulated in the node NDB, which is an intermediate node between the capacitor C3 and the capacitor C4, are transferred to the node NDC that is coupled to a pair of capacitors CP1 that subsequently performs a coupling operation without being discharged to the grounding wire VSS etc. The charge sharing decreases the voltage of the node NDB to about 8 V and increases the voltage of the node NDC to 7.5 V ((h) and (i) in FIG. 2).

The decrease in the voltage of the node NDB decreases a voltage that is applied to the capacitor C3 to about 3 V. The decreased amount of the voltage of the node NDD is larger than the decreased amount of the voltage of the node NDB. Hence, the voltage applied to the capacitor C4 decreases to about 1.5 V ((j) in FIG. 2). Moreover, the increased amount of the node NDC is larger than the increased amount of the voltage of the node NDA. Thus, the voltage applied to the capacitor C2 increases to about 2.5 V ((k) in FIG. 2). However, the node NDA is pre-charged to the power supply voltage VCC, thus the voltage applied to the capacitor C2 may be substantially minimum. Therefore, the booster circuit BST may be configured by using the capacitor C2 with a small withstanding voltage. Accordingly, the withstanding voltage of the capacitor C2 may be smaller than the withstanding voltage of the capacitor C1. In other words, reliability of the capacitor C2 may be improved.

When the clock φ2 returns to a low-level, the voltage of the node NDB decreases by a coupling effect of the capacitor C3 ((l) in FIG. 2). The voltage of the node NDB decreases about 5 V, that is substantially the same as the amplitude of the clock φ2, and becomes about 3 V. By following-up the voltage change of the node NDB, the voltage of the node NDD decreases by a coupling effect of the capacitor C4 ((m) in FIG. 2). The voltage of the node NDD decreases about 5 V, that is substantially the same as the amplitude of the clock φ2, and becomes about 4.5 V.

An operation in a cycle CYC1 generates a high voltage VHIGH (about 9.5 V) by electric charges accumulated in the node NDD and accumulates electric charges to the node NDA and the node NDC. Accumulation of electric charges to the node NDA and the node NDC is preparation for generating a high voltage VHIGH in a cycle CYC2. The electric charges accumulated in the node NDB while the clock φ4 is a low level are transferred to the node NDC without being discharged to the grounding wiring VSS etc. As a result, the electric charges supplied from the power supply line VCC may be utilized for generating a high voltage VHIGH without the electric charges being wasted. Accordingly, efficiency to generate the high voltage VHIGH may be improved; thereby power consumption of the booster circuit BST may be reduced to substantially minimum.

When the clock φ1 changes to a high level in the cycle CYC2, the voltage of the node NDA increases by a coupling effect of the capacitor C1 ((n) in FIG. 2). The voltage of the node NDA is pre-charged to the power supply voltage VCC in the cycle CYC 1. Thus, the voltage of the node NDA increases about 5V, that is substantially the same as the amplitude of the clock φ1, and becomes about 10 V. By following-up the voltage change of the node NDA, the voltage of the node NDC increases by a coupling effect of the capacitor C2 ((o) in FIG. 2). The voltage of the node NDC increases about 5V, that is substantially the same as the amplitude of the clock φ1, and becomes about 12.5 V.

The voltage of the node NDA changes by following-up the voltage of the clock φ1. Hence, a voltage applied to the capacitor C1 is maintained to about 5 V before and after the voltage change of the clock φ1. Similarly, the voltage of the node NDC changes by following up the voltage of the node NDA. Thus, a voltage applied to the capacitor C2 is maintained to about 2.5 V before and after the voltage change of the clock φ1 ((p) in FIG. 2).

An increase in the voltage of the node NDA turns on the switch NM2, thereby the node NDB is pre-charged up to about 5 V ((q) in FIG. 2). By following-up the voltage change of the node NDB, the voltage of the node NDD increases by a coupling effect of the capacitor C3 ((r) in FIG. 2). The voltage applied to the capacitor C3 gradually increases as the voltage of the node NDB increases. The increase in voltages of the nodes NDB and NDD are due to coupling effects, therefore, the voltage applied to the capacitor C4 may not be substantially changed ((s) in FIG. 2).

The clock φ3 changes from a high level to a low level for a certain period while the clock φ3 is in a high level period ((t) in FIG. 2). The low level of the clock φ3 turns on the switches PM3 and PM2. The electric charges charged to the node NDC are transferred to the node VHIGH through the switch PM3. As a result, the voltage of the node VHIGH increases to about 9.5 V and the voltage of the node NDC decreases to about 9.5 V. Turning on the switch PM2 causes charge sharing between the node NDA and the node NDD, and electric charges accumulated in the node NDA are transferred to the node NDD. The charge sharing decreases the voltage of the node NDA to about 8 V and increases the voltage of the node NDD to about 7.5 V ((u) and (v) in FIG. 2).

The decrease in the voltage of the node NDA decreases a voltage applied to the capacitor C1 to about 3 V. The decreased amount of the voltage of the node NDC is larger than the decreased amount of the voltage of the node NDA. Hence, the voltage applied to the capacitor C2 decreases to about 1.5 V ((w) in FIG. 2). Moreover, the increased amount of the voltage of the node NDD is larger than the increased amount of the voltage of the node NDB. Thus, the voltage applied to the capacitor C4 increases to about 2.5 V ((x) in FIG. 2). However, the node NDB is pre-charged to the power supply voltage VCC, thus the voltage applied to the capacitor C4 may be substantially minimum. Therefore, the booster circuit BST may be configured by using the capacitor C4 with a small withstanding voltage. Thus, a withstanding voltage of the capacitor C4 may be smaller than that of the capacitor C3. In other words, reliability of the capacitor C4 may be improved.

When the clock φ1 returns to a low-level, the voltage of the node NDA decreases by a coupling effect of the capacitor C1 ((y) in FIG. 2). The voltage of the node NDA decreases about 5 V, that is substantially the same as the amplitude of the clock φ1, and becomes about 3 V. By following-up the voltage change of the node NDA, the voltage of the node NDC decreases by a coupling effect of the capacitor C2 ((z) in FIG. 2). The voltage of the node NDC decreases about 5 V, that is substantially the same as the amplitude of the clock φ1, and becomes about 4.5 V.

An operation in a cycle CYC2 generates a high voltage VHIGH (about 9.5 V) by electric charges accumulated in the node NDC and accumulates electric charges to the node NDB and the node NDD. The accumulation of the electric charges to the node NDB and the node NDD is preparation for generating a high voltage VHIGH in a cycle CYC3. The electric charges accumulated in the node NDA while the clock φ3 is a low level are transferred to the node NDD without being discharged to the grounding wiring VSS etc. As a result, the electric charges supplied from the power supply line VCC may be utilized for generating a high voltage VHIGH without the electric charges being wasted. Accordingly, efficiency to generate the high voltage VHIGH may be improved; thereby power consumption of the booster circuit BST may be reduced to substantially minimum.

The cycle CYC2, the cycle CYC3 and thereafter are performed as in the cycle CYC1 and the cycle CYC2, and the high voltage VHIGH is continuously generated. As described above, according to the embodiment, a high voltage VHIGH is generated by alternately performing a coupling operation of two pairs of capacitors CP (CP1 and CP2) and electric charges that are conventionally discharged are transferred to a pair of capacitors that subsequently performs a coupling operation.

In the example, a substantially maximum voltage applied to each of the capacitors C1 and C3 is about 5 V, while a substantially maximum voltage applied to each of the capacitors C2 and C4 is about 2.5 V. Hence, withstanding voltages of the capacitors C1 and C3 may need to exceed 5 V and withstanding voltages of the capacitors C2 and C4 may need to exceed 2.5 V.

FIG. 3 illustrates an example of a semiconductor memory cell that includes the booster circuit BST illustrated in FIG. 1. For example, a semiconductor memory MEM is a nonvolatile semiconductor memory such as a flash memory. The semiconductor memory MEM includes an operation control unit 10, a voltage booster 12, an address latch 14, a Y decoder 16, an X decoder 18, a Y gate unit 20, a memory cell array 22, a data latch 24 and a data input/output buffer 26.

The operation control unit 10 receives a clock signal FCLK, a write enable signal WEX, and a chip enable signal CEX through external terminals. The write enable signal WEX and the chip enable signal CEX are command signals for accessing the memory cell array 22. As command signals, there are, but are not limited to, a program command (write command) for executing a program operation (write operation), a read command for executing a read operation, and an erase command for executing an erase operation. The operation control unit 10 generates a control signal (timing signal) for controlling operations of the voltage booster 12, the address latch 14, the Y decoder 16, the X decoder 18, the data latch 24 and the data input/output buffer 26.

For example, when the operation control unit 10 receives a program command, the operation control unit 10 outputs a program signal PGM for operating the voltage booster 12. Moreover, the operation control unit 10 receives a data signal DIN (write data) that is an expected value of a program verify operation and a verify data signal DOV that is a verify result of a program verify operation. The verify data signal DOV is also output from the Y gate unit 20 to the operation control unit 10 during an erase verify operation. The operation control unit 10 may operate without receiving a clock signal FCLK. In other words, the semiconductor memory MEM may be a clock asynchronous type.

The voltage booster 12 may include the booster circuit BST as illustrated in FIG. 1 and operate while a program signal PGM is active and generate a high voltage VHIGH. For example, a high voltage VHIGH is used as a high level for a control gate line CG (FIG. 4) while the program is operated. An example of the voltage booster 12 is illustrated in FIG. 5.

The address latch 14 latches an address signal FA supplied through the external terminal substantially in synchronization with a control signal from the operation control unit 10 and outputs the latched signal as a column address CA and a row address RA. For example, the column address CA is a lower bit of the address signal FA and the row address RA is an upper bit of the address signal FA.

The Y decoder 16 decodes the column address CA substantially in synchronization with the control signal from the operation control unit 10 and generates a column decode signal CD. The X decoder 18 decodes the row address RA substantially in synchronization with the control signal from the operation control unit 10 and generates a row decode signal RD for selecting a control gate line CG, a selection gate line SG, and a source line SL illustrated in FIG. 4.

The Y gate unit 20 turns on a Y gate that corresponds to the column decode signal CD. Turning on the Y gate couples a bit line BL that corresponds to a memory cell MC to be accessed in the memory cell array 22 illustrated in FIG. 4 with the data latch 24. The memory cell array 22 may include nonvolatile memory cells MC (FIG. 4) arranged in a matrix.

The data latch 24 latches a data input signal DIN substantially in synchronization with a control signal from the operation control unit 10 during a program operation in which a logic 0 is written to a memory cell MC and outputs the latched signal to the Y gate unit 20 through the data line DT. The data latch 24 latches read data that is output from the memory cell array 22 through the Y gate unit 20 and the data line DT substantially in synchronization with a control signal from the operation control unit 10 and outputs the latched signal to the data input/output buffer 26.

The data input/output buffer 26 outputs a data signal that is supplied to a data terminal I/O during a program operation as a data input signal DIN. The data input/output buffer 26 outputs read data DOR that is output from the data latch 24 to a data terminal I/O during a reading operation. According to the embodiment, an erase operation is performed for each sector. Thus, the data input/output buffer 26 does not receive a data signal I/O during an erase operation.

Figure 4:
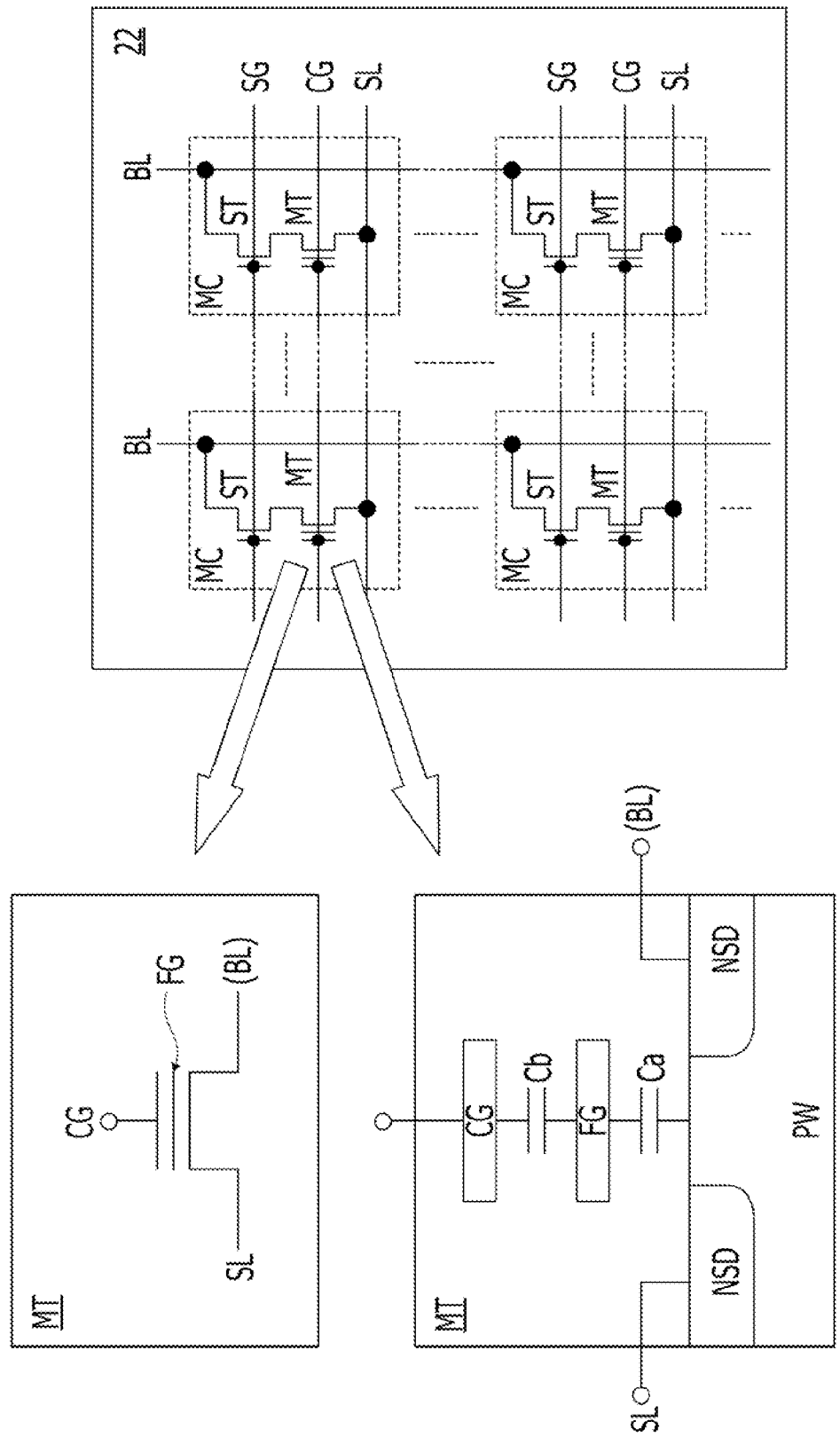
FIG. 4 illustrates an example of a memory cell array and a memory cell illustrated in FIG. 3.
Figure 5:
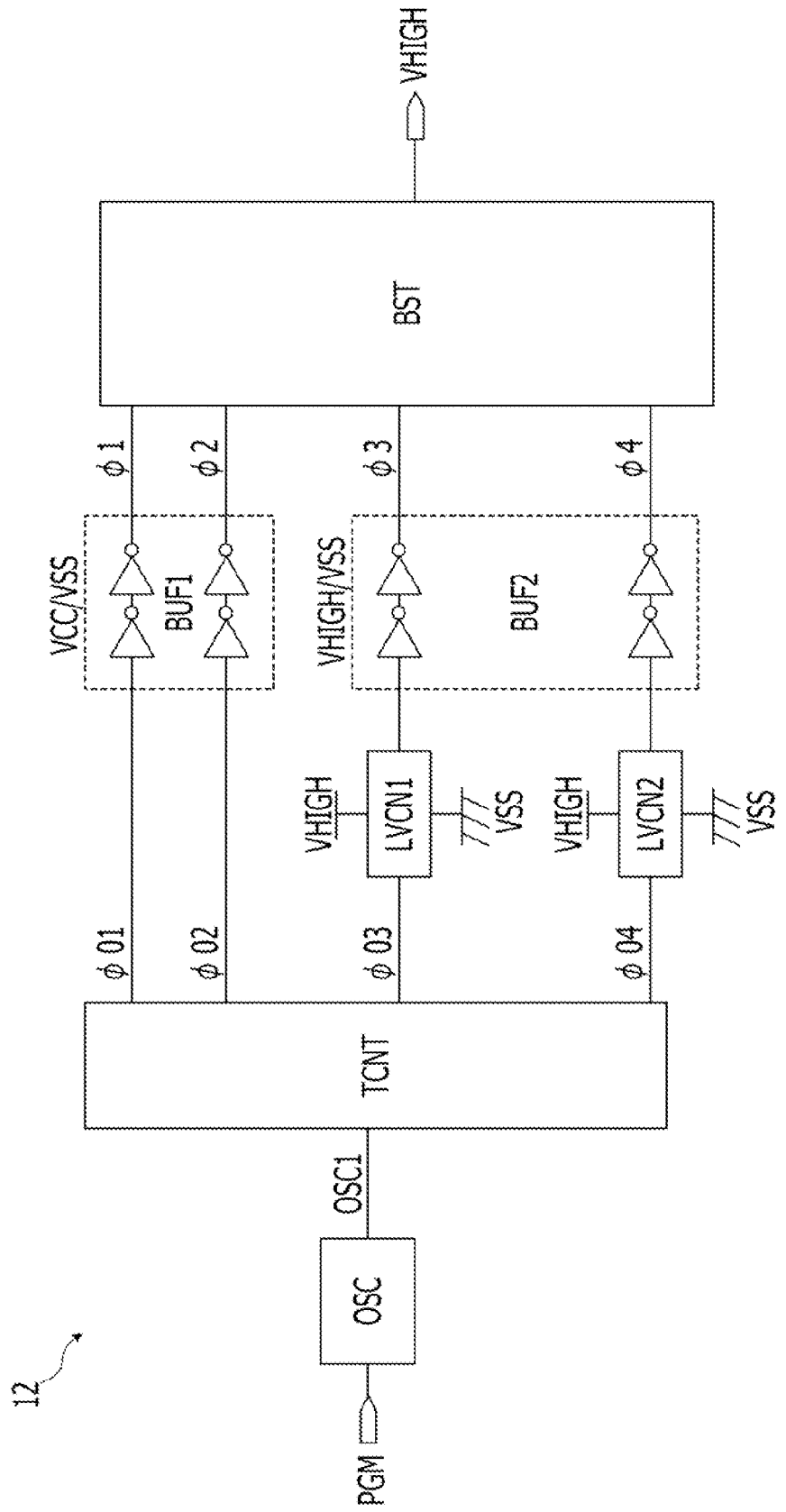
FIG. 5 illustrates an example of a voltage booster illustrated in FIG. 3.

FIG. 4 illustrates an example of a memory cell array 22 and memory cells MC illustrated in FIG. 3. The memory cell array 22 includes a plurality of nonvolatile memory cells MC arranged in a matrix. The selection gate line SG, the control gate line CG, and the source line SL are commonly coupled to a column of the memory cells MC that are arranged in the lateral direction in FIG. 4. A memory cell MC is selected by setting a selection gate line SG to a high level.

Each memory cell MC includes a memory transistor MT and a selection transistor ST that are serially arranged between the source line SL and the bit line BL. The memory transistor MT includes a floating gate FG that accumulates electrons and a control gate CG that is coupled to the control gate line CG. The memory cell MC may be formed typically with a memory transistor MT. Moreover, the memory transistor MT may be formed by using a trap gate in which electrons are accumulated in a certain place.

As illustrated in the lower left of FIG. 4, the memory transistor MT includes, for example, a structure of an nMOS transistor that is made up of a pair of n-type source-drain regions NSD formed over a p-type well region PW (semiconductor substrate). A capacitor Ca is formed by using an insulating film such as a nitride film provided between the p-type well region PW and a floating gate FG laminated over the p-type well region PW as a capacitance film. A capacitor Cb is formed by using an insulating film such as an oxide film provided between the floating gate FG and a control gate CG laminated over the floating gate FG.

For example, a withstanding voltage of the capacitor Ca is designed as about 6 V while that of the capacitor Cb is designed as about 4 V. Generally, a withstanding voltage is determined by composition and a thickness of an insulating film that forms the capacitor. As will be described by referring to FIGS. 6 to 8, capacitors C1 and C3 of the booster circuit BST may be manufactured by substantially the same manufacturing process as that of the capacitor Ca, and capacitors C2 and C4 of the booster circuit BST may be manufactured by substantially the same manufacturing process as that of the capacitor Cb. As illustrated in FIG. 2, a substantially maximum voltage applied to the capacitors C1 and C3 is about 5 V. A substantially maximum voltage applied to the capacitors C2 and C4 is about 2.5 V. Therefore, the capacitors C1 to C4 may be manufactured by using the manufacturing process of the memory transistor MT. The booster circuit BST that includes capacitors C1 and C2 (or C3 and C4) to which different voltages are applied may be easily formed by using a pair of capacitors of a memory transistor MT of a nonvolatile memory cell.

When withstanding voltages are satisfied, capacitors C1 and C3 may be formed with substantially the same manufacturing process, and capacitors C2 and C4 may be formed with substantially the same manufacturing process.

A threshold voltage of the memory transistor MT changes by changing electric charges accumulated in the floating gate FG according to a control gate voltage CG applied to the control gate CG. The memory transistor MT stores a data logic according to a threshold voltage. The selection transistor ST may be an nMOS transistor in which a gate is coupled to a selection gate line SG. Turning on the selection transistor ST couples the memory transistor MT to a bit line BL.

FIG. 5 illustrates an example of the voltage booster 12 illustrated in FIG. 3. The voltage booster 12 includes an oscillator OSC, a timing control circuit TCNT, level converters, LVCN1 and LVCN2, buffers, BUF1 and BUF2, and the booster circuit BST illustrated in FIG. 1. For example, the oscillator OSC, the timing control circuit TCNT, the level converters, LVCN1 and LVCN2, and the buffers, BUF1 and BUF2 are formed in the booster control circuit BSTCNT illustrated in FIG. 1.

The oscillator OSC performs an oscillation operation while the oscillator OSC receives a program signal PGM from the operation control circuit 10 illustrated in FIG. 3 and outputs an oscillation signal OSC1 to the timing control circuit TCNT. The program signal PGM is generated when a program operation is executed in response to a program command. For example, a cycle of an oscillation signal OSC1 may be substantially the same as each of the cycles CYC1 to CYC5 illustrated in FIG. 2.

The timing control circuit TCNT includes a delay circuit and a logic circuit and generates oscillation signals $\phi 01$, $\phi 02$, $\phi 03$, and $\phi 04$ substantially in synchronization with the oscillation signal OSC1. Timings to generate the oscillation signals $\phi 01$, $\phi 02$, $\phi 03$, and $\phi 04$ may be substantially the same as $\phi 1$, $\phi 2$, $\phi 3$, and $\phi 4$ illustrated in FIG. 2.

The level converters LVCN1 and LVCN2 may be substantially the same circuits. The level converter LVCN1 converts a high level of the oscillation signal φ03 from the power supply voltage VCC into a high voltage VHIGH. The level converter LVCN2 converts a high level of the oscillation signal φ04 from the power supply voltage VCC into a high voltage VHIGH.

The buffer BUF1 operates by receiving the power supply voltage VCC and a grounding voltage VSS. The buffer BUF1 includes an even number of serially coupled inverters for each of the oscillation signals φ01 and φ02. The buffer BUF1 outputs the oscillation signal φ1 substantially in synchronization with the oscillation signal φ01, and outputs the oscillation signal φ2 substantially in synchronization with the oscillation signal φ02. The amplitude of the oscillation signals φ1 and φ2 is about 5 V, that is substantially equal to the power supply voltage VCC.

The buffer BUF2 operates by receiving the high voltage VHIGH and the grounding voltage VSS. The buffer BUF2 includes an even number of serially coupled inverters for each of the oscillation signals φ03 and φ04. The buffer BUF2 outputs the oscillation signal φ3 substantially in synchronization with the oscillation signal φ03 and outputs the oscillation signal φ4 substantially in synchronization with the oscillation signal φ04. The amplitude of the oscillation signals OSC3 and OSC4 is about 9.5 V, that is substantially equal to the high voltage VHIGH.

A value of a high voltage VHIGH is lower than about 9.5 V when the booster circuit BST starts an operation. A high voltage VHIGH that is supplied to the level converters LVCN1 and LVCN2, and the buffer BUF2 increases as the operation of the booster circuit BST progresses.

Figure 6:
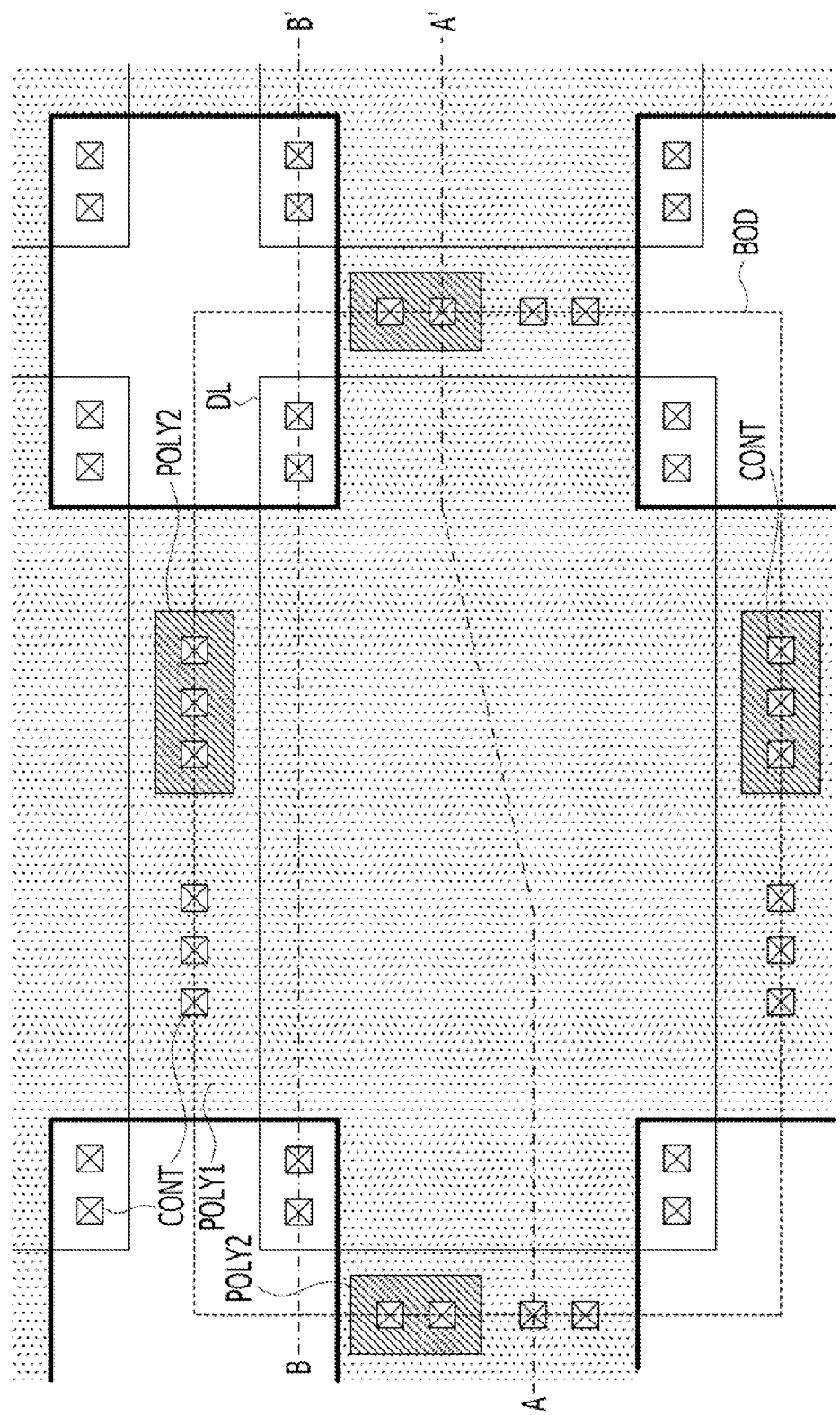
FIG. 6 illustrates a layout example of a pair of capacitors illustrated in FIG. 1.

FIG. 6 illustrates a layout example of the pair of capacitors, CP1 and CP2 illustrated in FIG. 1. For example, the pair of capacitors, CP1 and CP2 is formed by using a manufacturing process of the capacitors Ca and Cb formed in the memory cell MC illustrated in FIG. 4. For example, the capacitors C1 and C3 illustrated in FIG. 1 are formed by using an insulating film between a polysilicon film for the floating gate FG and the p-type well region PW as a capacitance film. For example, the capacitors C2 and C4 illustrated in FIG. 1 are formed by using an insulating film between a polysilicon layer POLY1 for the control gate CG and a polysilicon layer POLY2 for the floating gate FG as a capacitance film.

The light-shaded area in FIG. 6 illustrates an electrode made up of a polysilicon layer POLY1 that is substantially the same layer as a layer in which a control gate CG is formed. The dark-shaded area with diagonal lines in FIG. 6 illustrates an electrode made up of a polysilicon layer POLY2 that is substantially the same layer as a layer in which a floating gate FG is formed. Note that the electrode made up of the polysilicon layer POLY2 is also formed under the electrode made up of the polysilicon layer POLY1. Therefore, the electrode made up of the polysilicon layer POLY 2 is formed in the light-shaded area and the dark-shaded area with diagonal lines. In other words, the electrode made up of the polysilicon layer POLY1 includes a hole indicated by the dark-shaded area with diagonal lines in order to make an upper wiring contact with the electrode made up of the polysilicon layer POLY2.

A square with an X inside in FIG. 6 indicates a contact CONT. The contact CONT over the light-shaded area couples the upper wiring with the polysilicon layer POLY1. The contact CONT over the dark-shaded area with diagonal lines couples the upper wiring with the polysilicon layer POLY2. Other contacts CONT couple the upper wiring with a diffusion layer (the source-drain region NSD illustrated in FIG. 4).

The thin solid-line rectangle indicates a diffusion layer region DL. The dashed-line rectangle indicates a repetition unit of a layout. Each of the pair of capacitors, CP1 and CP2 is formed by repeating a disposition of the layout in FIG. 6 for the number of times as required. When the number of the disposed capacitors is larger, the capacitance value becomes larger.

Figure 7:
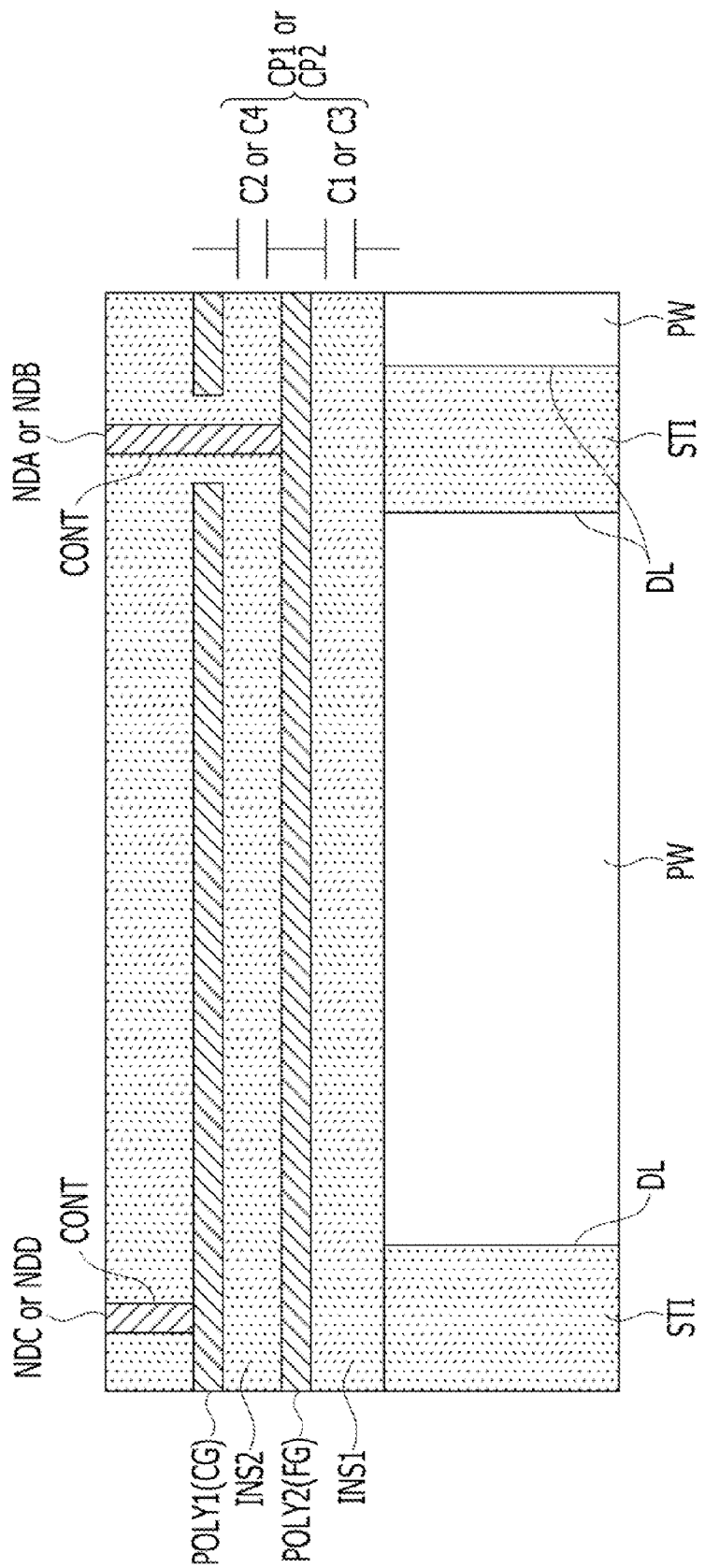
FIG. 7 is an example of a cross sectional view along an A-A' line illustrated in FIG. 6.

FIG. 7 is an example of a cross-sectional view along line A-A' illustrated in FIG. 6. In FIG. 7, the dark-shaded area with diagonal lines indicates a conductor while the light-shaded area indicates an insulator. The contact CONT coupled to a polysilicon layer POLY1 is coupled to the node NDC or the node NDD illustrated in FIG. 1. The contact CONT coupled to the polysilicon layer POLY2 is coupled to the node NDA or the node NDB illustrated in FIG. 1. For example, the contact CONT is a plug contact.

The capacitor C1 of the pair of capacitors CP1 or the capacitor C3 of the pair of capacitors CP2 is formed by an insulating film INS1 between the polysilicon layer POLY2 (FG) and the p-type well region PW. The capacitor C2 of the pair of capacitors CP1 or the capacitor C4 of the pair of capacitors CP2 is formed by an insulating film INS2 between the polysilicon layer POLY1 (CG) and the polysilicon layer POLY2 (FG). The p-type well region PW is formed inside of the diffusion layer region DL illustrated in FIG. 6. An element isolation region STI is formed outside of the p-type well region PW.

Figure 8:
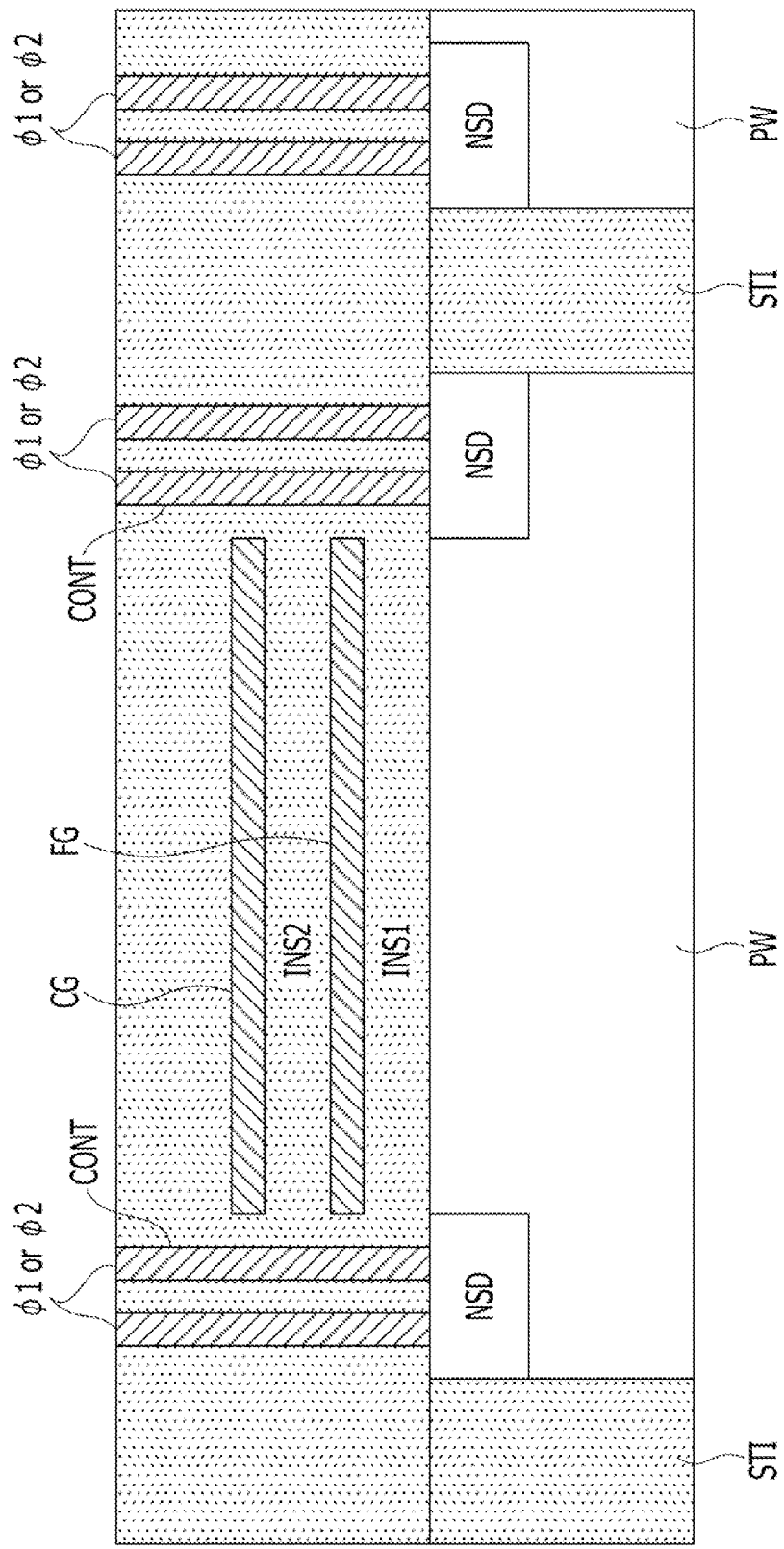
FIG. 8 is an example of a cross sectional view along a B-B' line illustrated in FIG. 6.

FIG. 8 is an example of a cross-sectional view along line B-B' illustrated in FIG. 6. In FIG. 8, the dark-shaded area with diagonal lines indicates a conductor while the light-shaded area indicates an insulator. The contact CONT coupled to the source-drain region NSD is coupled to the node φ1 or the node φ2 illustrated in FIG. 1. For example, in a manufacturing process of a semiconductor MEM, the capacitors C1 to C4 of the booster circuit BST illustrated in FIG. 1 are formed together with a control gate CG and a floating gate FG of a memory transistor MT.

According to an embodiment, electric charges accumulated in an intermediate node (for example, the NDA) of one of a pair of capacitors (for example, CP1), is transferred to the node NDD that is coupled to the other pair of capacitors (for example, CP2) that subsequently performs a coupling operation without being discharged to a grounding wire VSS etc. As a result, the electric charges supplied from the power supply line VCC may be utilized for generating a high voltage VHIGH without the electric charges being wasted. Accordingly, efficiency to generate the high voltage VHIGH may be improved; thereby power consumption of the booster circuit BST may be reduced.

The booster circuit BST that includes capacitors C1 and C2 (or C3 and C4) to which different voltages are applied may be easily formed by using a pair of capacitors of a memory transistor MT of a nonvolatile memory cell. In other words, the booster circuit BST that includes capacitors C1 and C2 to which different voltages are applied may be easily formed by using a pair of capacitors of a nonvolatile memory cell with different withstanding voltages.

According to the above described embodiment, an example is explained in which a booster circuit BST that generates a high voltage applied to a control gate CG of a memory cell MC is formed over a semiconductor memory MEM that includes a nonvolatile memory cell MC. However, the booster circuit BST may be formed over other semiconductor memories such as a Dynamic Random Access Memory (DRAM) and a Static Random Access Memory (SRAM) for generating a high voltage that is applied to a gate (control gate) of a transfer transistor of a memory cell.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments in accordance with aspects of the present inventions have been described in detail, it should be understood that various changes, substitutions, and alterations could be made hereto without departing from the spirit and scope of the invention.

What is claimed is:

1. A booster circuit comprising:
   a first capacitor and a second capacitor serially coupled between a first node and a second node through a third node;
   a third capacitor and a fourth capacitor serially coupled between a fourth node and a fifth node through a sixth node;
   a first switch that couples the third node with a power supply line when the fourth node is set to a first level;
   a second switch that couples the sixth node with the power supply line when the first node is set to the first level;
   a third switch that transfers a plurality of electric charges of the sixth node to the second node;
   a fourth switch that transfers a plurality of electric charges of the third node to the fifth node;
   a fifth switch that couples the second node with a voltage line; and
   a sixth switch that couples the fifth node with the voltage line.

2. The booster circuit according to claim 1, further comprising:
   a booster control circuit that alternately sets the first node and the fourth node to the first level, and turns on the fourth switch and the fifth switch while the first node is set to the first level, and turns on the third switch and the sixth switch while the fourth node is set to the first level.

3. The booster circuit according to claim 1, wherein
   the first switch includes a first transistor with a gate coupled to the sixth node, a source coupled to the third node, and a drain coupled to the power supply line; and
   the second switch includes a second transistor with a gate coupled to the third node, a source coupled to the sixth node, and a drain coupled to the power supply line.

4. The booster circuit according to claim 1, wherein
   the third switch includes a third transistor with a gate coupled to a seventh node, a source coupled to the second node, and a drain coupled to the sixth node;
   the fourth switch includes a fourth transistor with a gate coupled to an eighth node, a source coupled to the fifth node, and a drain coupled to the third node;
   an amplitude of a voltage of the seventh node that is applied to the gate of the third transistor in order to turn on/off the third switch is larger than an amplitude of a voltage applied to the first node; and
   an amplitude of a voltage of the eighth node that is applied to the gate of the fourth transistor in order to turn on/off the fourth switch is larger than an amplitude of a voltage applied to the fourth node.

5. The booster circuit according to claim 1, wherein
   the fifth switch includes a fifth transistor with a gate coupled to an eighth node, a source coupled to the voltage line, and a drain coupled to the second node;
   the sixth switch includes a sixth transistor with a gate coupled to a seventh node, a source coupled to the voltage line, and a drain coupled to the fifth node;
   an amplitude of a voltage of the eighth node that is applied to a gate of the fifth transistor in order to turn on/off the fifth switch is larger than an amplitude of a voltage applied to the first node; and
   an amplitude of a voltage of the seventh node that is applied to a gate of the sixth transistor in order to turn on/off the sixth switch is larger than an amplitude of a voltage applied to the second node.

6. A semiconductor memory comprising:
   a booster circuit includes:
   a first capacitor and a second capacitor serially coupled between a first node and a second node through a third node;
   a third capacitor and a fourth capacitor serially coupled between a fourth node and a fifth node through a sixth node;
   a first switch that couples the third node with a power supply line when the fourth node is set to a first level;
   a second switch that couples the sixth node with the power supply line when the first node is set to a first level;
   a third switch that transfers a plurality of electric charges of the sixth node to the second node;
   a fourth switch that transfers a plurality of electric charges of the third node to the fifth node;
   a fifth switch that couples the second node with a voltage line; and
   a sixth switch that couples the fifth node to the voltage line;
   a booster control circuit configured to alternately set the first node and the fourth node to the first level and turns on the fourth switch and the fifth switch while the first node is set to the first level and turns on the third switch and the sixth switch while the fourth node is set to the first level; and
   a memory cell that includes a control gate, wherein a voltage supplied to the control gate is generated by using a voltage that is generated by the booster circuit to the voltage line.

7. The semiconductor memory according to claim 6, wherein
   the memory cell is a nonvolatile memory cell that includes a floating gate laminated over a semiconductor substrate through a first insulating film and a control gate laminated over the floating gate through the second insulating film;
   each of the first capacitor and the third capacitor is formed by using the first insulating film as a capacitance film; and
   each of the second capacitor and the fourth capacitor is formed by using the second insulating film as a capacitance film.

8. The semiconductor memory according to claim 6, wherein
   withstanding voltages of the first capacitor and the third capacitor are higher than withstanding voltages of the second capacitor and the fourth capacitor.

9. The semiconductor memory according to claim 6, wherein
   the first switch includes a first transistor with a gate coupled to the sixth node, a source coupled to the third node, and a drain coupled to the power supply line; and
   the second switch includes a second transistor with a gate coupled to the third node, a source coupled to the sixth node, and a drain coupled to the power supply line.

10. The semiconductor memory according to claim 6, wherein the third switch includes a third transistor with a gate coupled to a seventh node, a source coupled to the second node, and a drain coupled to the sixth node;

the fourth switch includes a fourth transistor with a gate coupled to an eighth node, a source coupled to the fifth node, and a drain coupled to the third node;

an amplitude of a voltage of the seventh node that is applied to the gate of the third transistor in order to turn on/off the third switch is larger than an amplitude of a voltage applied to the first node; and an amplitude of a voltage of the eighth node that is applied to the gate of the fourth transistor in order to turn on/off the fourth switch is larger than an amplitude of a voltage applied to the fourth node.

11. The semiconductor memory according to claim 6, wherein the fifth switch includes a fifth transistor with a gate coupled to an eighth node and a source coupled to the voltage line, and a drain coupled to the second node;

the sixth switch includes a sixth transistor with a gate coupled to the seventh node, a source coupled to the voltage line, and a drain coupled to the fifth node;

an amplitude of a voltage of the eighth node that is applied to the gate of the fifth transistor in order to turn on/off the fifth switch is larger than an amplitude of a voltage applied to the first node; and an amplitude of a voltage of the seventh node that is applied to the gate of the sixth transistor in order to turn on/off the sixth switch is larger than an amplitude of a voltage applied to the second node.

\* \* \* \* \*